(12) United States Patent
Nishimura

(10) Patent No.: US 6,995,629 B2
(45) Date of Patent: Feb. 7, 2006

(54) CENTER-TAP TERMINATION CIRCUIT AND PRINTED CIRCUIT BOARD HAVING THE SAME

(75) Inventor: Shinichi Nishimura, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 146 days.

(21) Appl. No.: 10/695,732

(22) Filed: Oct. 28, 2003

(65) Prior Publication Data

US 2004/0119553 A1   Jun. 24, 2004

(30) Foreign Application Priority Data

Oct. 31, 2002   (JP) ............................... 2002-317472

(51) Int. Cl.
*H03H 7/38* (2006.01)
*H01P 1/16* (2006.01)
(52) U.S. Cl. ...................... 333/22 R; 333/17.3; 333/32
(58) Field of Classification Search .............. 333/22 R, 333/32, 17.3; 326/30
See application file for complete search history.

(56) References Cited

U.S. PATENT DOCUMENTS

| | | | |
|---|---|---|---|
| 5,242,858 A | 9/1993 | Sakamoto et al. .......... 437/162 |
| 5,374,861 A * | 12/1994 | Kubista ....................... 326/30 |
| 5,438,218 A | 8/1995 | Nakamura et al. .......... 257/452 |
| 5,476,799 A | 12/1995 | Sakamoto et al. ............ 437/25 |
| 5,781,028 A * | 7/1998 | Decuir ......................... 326/30 |
| 6,208,161 B1 | 3/2001 | Suda ........................... 326/30 |
| 6,448,813 B2 * | 9/2002 | Garlepp et al. ............... 326/83 |
| 6,492,880 B1 * | 12/2002 | Chiappe et al. ........... 333/22 R |
| 6,825,693 B2 * | 11/2004 | Schoenborn et al. .......... 326/86 |
| 6,856,165 B2 * | 2/2005 | Rall ............................ 326/30 |

FOREIGN PATENT DOCUMENTS

JP   11-205118   7/1999

* cited by examiner

*Primary Examiner*—Robert Pascal
*Assistant Examiner*—Kimberly Glenn
(74) *Attorney, Agent, or Firm*—Fitzpatrick, Cella, Harper & Scinto

(57) ABSTRACT

A center-tap termination circuit which includes two resistors having the same resistance, which are serially connected between forward and return transmission lines, where the forward and return transmission lines constitute a differential signal transmission line. A capacitor is connected between a connector that interconnects the two resistors and a GND of 6 a printed circuit board. The forward and return transmission lines are substantially equidistant from each other along their lengths. The resistors and the capacitor are arranged outside the forward and return transmission lines. The connector is provided intersecting, in three-dimensional space, the forward and return transmission lines, such as being formed by a jumper bridging the two lines, or by being formed on a different layer of a multilayer printed circuit board. Variations in the differential impedance are suppressed, and the transmission return/transmission forward characteristics of differential signals are substantially matched. The differential impedance matching is achieved, and high-quality signal waveforms are maintained. Not only noise emitted due to differential mode current components, but also noise emitted due to common mode current components are suppressed.

13 Claims, 11 Drawing Sheets

CENTER-TAP TERMINATION CIRCUIT AND PRINTED CIRCUIT BOARD HAVING THE SAME

BACKGROUND OF THE INVENTION

1. Field of the Invention

The present invention relates to a center-tap termination circuit in a differential signal transmission line for transmitting a high-speed differential signal.

2. Description of the Related Art

Low voltage differential signaling (LVDS) technology is used to suppress noise emissions when transmitting high-speed signals on a printed circuit board or using cables. FIG. 9 is a circuit diagram of a typical LVDS transmission model.

FIG. 9 depicts a ground 1100 (GND), a transmitting driver Integrated Circuit (IC) 1200, and a receiver IC 1300. Between the transmitting driver IC 1200 and the receiver IC 1300, a forward transmission line 1101 and a return transmission line 1102 are provided. The forward transmission line 1101 and the return transmission line 1102 constitute a differential signal transmission line for transmitting a low-voltage differential signal. In the differential signal transmission line, the forward transmission line 1101 and the return transmission line 1102 are designed to have the same electrical characteristics. In the vicinity of the input port of the receiver IC 1300, a resistor 1103 is connected between the forward transmission line 1101 and the return transmission line 1102. The resistor 1103 terminates the differential signal transmission line. In a case where the differential signal transmission line is designed to have a differential impedance of 100 Ω, differential mode current components flowing through the differential signal transmission line are completely matched and hence terminated by the resistor 1103 having a resistance of 100 Ω.

In addition to the differential mode current components, common mode current components 1110 flow through the differential signal transmission line shown in FIG. 9, which may cause noise emissions that cannot be ignored. Specifically, since the termination circuit shown in FIG. 9 has no line through which common mode current components 1110 can flow, the common mode current components 1110 return to the ground 1100 via a stray capacitance of the printed circuit board. Because this stray capacitance is unstable, cancellation of the common mode current components 1110 by return current becomes unstable, resulting in the emission of a large amount of noise. This emission of noise can cause serious problems, if the ground plane is defective.

To suppress the generation of such noise emissions due to common mode current components, Japanese Patent Laid-Open No. 11-205118 discloses a center-tap termination circuit. FIGS. 10A and 10B show this center-tap termination circuit used in an LVDS transmission model described in this document.

FIG. 10A is a circuit diagram of the center-tap termination circuit. Referring to FIG. 10A, in the vicinity of the input port of the receiver IC 1300, resistors 1104 and 1105 are serially connected between the forward transmission line 1101 and the return transmission line 1102. Between a connector that interconnects the resistors 1104 and 1105 and the GND 1100, a capacitor 1106 is connected. The resistors 1104 and 1105 and the capacitor 1106 constitute the center-tap termination circuit.

FIG. 10B is a plan view of the center-tap termination circuit shown in FIG. 10A, which is implemented on a printed circuit board. In FIG. 10B, components corresponding to those in FIG. 10A are given the same reference numerals.

Referring to FIG. 10B, reference numeral 1500 denotes a printed circuit board. The forward transmission line 1101 and the return transmission line 1102 are made from copper foil patterns. The resistors 1104 and 1105 have the same resistance, and are chip resistors, and capacitor 1106 is a chip capacitor. The forward transmission line 1101 and the return transmission line 1102 extend to the left of FIG. 10B and are connected to the transmitting driver IC (not shown). Similarly, the forward transmission line 1101 and the return transmission line 1102 extend to the right of FIG. 10B and are connected to the receiver IC (not shown). Since the resistors 1104 and 1105 and the capacitor 1106 are included in the termination resistor circuit, they are disposed in the vicinity of the receiver IC. The GND 1100 is provided around the forward transmission line 1101 and the return transmission line 1102.

First terminals of the resistors 1104 and 1105 are mounted on lands 1121 and 1123, respectively, and electrically connected to the forward transmission line 1101 and the return transmission line 1102, respectively. Second terminals of the resistors 1104 and 1105 are mounted on lands 1122 and 1124, respectively, inside the forward transmission line 1101 and the return transmission line 1102. The lands 1122 and 1124 are electrically connected to each other by wiring. Since the lands 1122 and 1124 are connected with each other, in conjunction with the forward transmission line 1101 and the return transmission line 1102, through a resistance of 50 Ω, the lands 1122 and 1124 correspond to the central potential of the differential signal transmission line. The lands 1122 and 1124 are electrically connected to a land 1125 by other wiring. A first terminal of the capacitor 1106 is mounted on the land 1125. Passing over the return transmission line 1102, a second terminal of the capacitor 1106 is connected to a land 1126 that is electrically connected to the GND 1100.

With the center-tap termination circuit described above, the forward transmission line 1101 is connected to the GND 1100 via the resistor 1104 and the capacitor 1106, and the return transmission line 1102 is connected to the GND 1100 via the resistor 1105 and the capacitor 1106. The common mode current components 1110 are thus negated by the impedance between the resistor 1104 and the capacitor 1106 and the impedance between the resistor 1105 and the capacitor 1106. With respect to the common mode current components 1110 on the differential signal transmission line, a path is ensured for return current 1120 flowing through the GND 1100. As a result, noise emissions due to the common mode current components 1110 are suppressed.

Since the forward transmission line 1101 is connected to the return transmission line 1102 through the resistors 1104 and 1105, the differential mode current components are completely matched with each other and are thus terminated, as shown in FIG. 9. To this end, the resistances of the resistors 1104 and 1105 should be chosen so that the combined resistances of the serially-connected resistors 1104 and 1105 are approximately equal to the differential impedance of the differential signal transmission line consisting of the forward transmission line 1101 and the return transmission line 1102.

Due to recent increases in the speed and frequency of signals used in differential signal transmission lines, noise emissions due to common mode current components generated by the differential impedance mismatching of the differential signal transmission line have become a problem.

In particular, differential impedance mismatching due to variations in distance between a forward transmission line and a return transmission line, which constitute the differential signal transmission line, has become a serious problem.

A center tap termination circuit is included in the differential signal transmission line shown in FIGS. 10A and 10B. As such, the distance between the forward transmission line 1101 and the return transmission line 1102 at the position of the center-tap termination circuit is much greater than the distance at any other position on the differential signal transmission line.

FIG. 11A is a sectional view of the printed circuit board taken along line 11A—11A of FIG. 10B, and FIG. 11B is a sectional view taken along line 11B—11B of FIG. 10B. Generally, the differential impedance of the differential signal transmission line changes in accordance with the distance between the forward transmission line 1101 and the return transmission line 1102, the distance between the forward transmission line 1101 and the GND pattern, and the distance between the return transmission line 1102 and the GND pattern in the sectional view of the printed circuit board.

FIGS. 11A and 11B depict the capacitive coupling 1151 between the forward transmission line 1101 and the return transmission line 1102, the capacitive coupling 1153 between the forward transmission line 1101 and the GND 1100, and the capacitive coupling 1152 between the return transmission line 1102 and the GND 1100. Referring to FIG. 11B, the capacitive coupling 1152 and the capacitive coupling 1153 are not greatly changed from those shown in FIG. 11A, whereas the capacitive coupling 1151 is greatly reduced from that shown in FIG. 11A. Since smaller capacitive couplings generate larger differential impedances, the differential impedance at line 11A—11A is not the same as the differential impedance at line 11B—11B. As such, common mode current components are generated due to signal reflections.

FIG. 12 is a graph showing the waveforms of differential signals in the above case in which time is shown on the abscissa, and voltage is shown on the ordinate. Referring to FIG. 12, reference numeral 600 denotes a signal transmitted through the forward transmission line 1101, and reference numeral 700 denotes a signal transmitted through the return transmission line 1102. As is clear from FIG. 12, the transmission return/transmission forward (tr/tf) characteristics of the signals 600 and 700 do not match each other due to differential impedance mismatching, causing skew. As a result, many common mode current components are generated on the differential signal transmission line, resulting in increased noise emissions.

In a case where a plurality of chip components are mounted on a printed circuit board, the chip components need to be separated from one another by a predetermined distance due to the mechanical limitations of a mounting machine. In the center-tap termination circuit shown in FIGS. 10A and 10B, there is a "dead space" between the resistors 1104 and 1105. The larger the distance between the forward transmission line 1101 and return transmission line 1102, the greater the differential impedance, resulting in a further increase in common mode current components. The area in which the center-tap termination circuit is mounted is increased, resulting in a smaller degree of freedom in circuit design.

SUMMARY OF THE INVENTION

It is an object of the present invention to suppress noise emission from a center-tap termination circuit in a differential signal transmission line by suppressing not only noise emissions generated by differential mode current components, but also noise emissions generated by common mode current components. Specifically, it is an object of the present invention to provide, in a differential signal transmission line, a center-tap termination circuit for suppressing variations in the differential impedance value caused by the provision of the center-tap termination circuit, matching the transmission return/transmission forward characteristics of differential signals, preventing the generation of skew, matching differential impedance, and maintaining high-quality signal waveforms.

Thus according to one aspect of the present invention, the foregoing object is attained by providing a center-tap termination circuit wired on a printed circuit board, the center-tap termination circuit being provided at the end of a differential signal transmission line having a forward transmission line and a return transmission line. The center-tap termination circuit includes a first resistor having a resistance of approximately half the differential impedance of the differential signal transmission line, where the first resistor is arranged outside the forward transmission line and the return transmission line and adjacent to the forward transmission line, and one end of the first resistor is electrically connected to the forward transmission line, and a second resistor having a resistance of approximately half the differential impedance of the differential signal transmission line, where the second resistor is arranged outside the forward transmission line and the return transmission line and adjacent to the return transmission line, and one end of the second resistor is electrically connected to the return transmission line. The center-tap termination circuit also includes a connector electrically connected to the end of the first resistor not connected to the forward transmission line and to the end of the second resistor not connected to the return transmission line, where the connector intersects the forward transmission line and the return transmission line in three-dimensional space, and a first capacitor arranged outside the forward transmission line and the return transmission line, where one end of the first capacitor is electrically connected to the connector, and the end of the first capacitor not connected to the connector is connected to a ground of the printed circuit board. The forward transmission line and the return transmission line are substantially equidistant from each other.

In a first preferred aspect, the connector comprises a component with a jumper function.

In a second preferred aspect, the first capacitor has a value of greater than or equal to 1000 pF and less than or equal to 100 $\mu$F.

In a third preferred aspect, a center-tap termination circuit wired is provided on a printed circuit board, the center-tap termination circuit being provided at the end of a differential signal transmission line having a forward transmission line and a return transmission line. The center-tap termination circuit includes a first resistor having a resistance of approximately half the differential impedance of the differential signal transmission line, where the first resistor is arranged outside the forward transmission line and the return transmission line and adjacent to the forward transmission line, and one end of the first resistor is electrically connected to the forward transmission line, and a second resistor having a resistance of approximately half the differential impedance of the differential signal transmission line, where the second resistor is arranged outside the forward transmission line and the return transmission line and adjacent to the return transmission line, and one end of the second resistor is electrically connected to the return transmission line. Additionally, the center-tap termination circuit includes a connector electrically connected to the end of the first resistor not connected to the forward transmission line and to the other end of the second resistor not connected to the return transmission line, where the connector intersects the forward transmission line and the return transmission line in three-dimensional space, and a first capacitor arranged outside the forward transmission line and the return transmission line, where one end of the first capacitor is electrically connected to the connector, and the end of the first capacitor not connected to the connector is connected to a ground of the printed circuit board. Furthermore, the center-tap termination circuit includes a second capacitor having the same capacitance as that of the first capacitor, where the second capacitor is arranged outside the forward transmission line and the return transmission line, one end of the second capacitor is electrically connected to the connector, and the end of the second capacitor not connected to the connector is connected to the ground of the printed circuit board. Additionally, the first and second resistors and the first and second capacitors are arranged line-symmetrically with respect to the differential signal transmission line, and the forward transmission line and the return transmission line are substantially equidistant from each other.

In a fourth preferred aspect, the connector comprises a component with a jumper function.

In a fifth preferred aspect, the first and second capacitors each have a value of greater than or equal to 1000 pF and less than or equal to 100 $\mu$F.

In a sixth preferred aspect, the printed circuit board comprises a multilayer printed circuit board having a plurality of layers, where the differential signal transmission line is provided on a surface layer of the printed circuit board, the first capacitor is connected through a first through hole to a ground provided on a wiring layer differing from the surface layer of the printed circuit board, and the second capacitor is connected through a second through hole to the ground provided on the wiring layer differing from the surface layer of the printed circuit board.

In a seventh preferred aspect, the printed circuit board comprises a multilayer printed circuit board having a plurality of layers, where the differential signal transmission line is provided on a surface layer of the printed circuit board, and where the connector comprises a wire led through third and fourth through holes to a wiring layer differing from the surface layer of the printed circuit board.

In an eighth preferred aspect, a center-tap termination circuit wired is provided on a printed circuit board, the center-tap termination circuit being provided at the end of a differential signal transmission line having a forward transmission line and a return transmission line. The center-tap termination circuit includes a first resistor having a resistance of approximately half the differential impedance of the differential signal transmission line, where the first resistor is arranged outside the forward transmission line and the return transmission line and adjacent to the forward transmission line, and one end of the first resistor is electrically connected to the forward transmission line, and a second resistor having a resistance of approximately half the differential impedance of the differential signal transmission line, where the second resistor is arranged outside the forward transmission line and the return transmission line and adjacent to the return transmission line, and one end of the second resistor is electrically connected to the return transmission line. The center-tap termination circuit includes a connector electrically connected to the end of the first resistor not connected to the forward transmission line and to the end of the second resistor not connected to the return transmission line, where the connector intersects the forward transmission line and the return transmission line in three-dimensional space, and a first capacitor arranged outside the forward transmission line and the return transmission line, where one end of the first capacitor is electrically connected to the connector. Furthermore, the center-tap termination circuit includes a second capacitor having the same capacitance as that of the first capacitor, where the second capacitor is arranged outside the forward transmission line and the return transmission line, and one end of the second capacitor is electrically connected to the connector, and a third resistor arranged outside the forward transmission line and the return transmission line, where one end of the third resistor is electrically connected to the other end of the first capacitor, the end of the third resistor not connected to the first capacitor is electrically connected to a ground of the printed circuit board, and the third resistor has a resistance that is twice the value derived by subtracting half the value of the first or second resistor from the common mode impedance of the differential signal transmission line. Moreover, the center-tap termination circuit includes a fourth resistor having the same resistance as that of the third resistor, where the fourth resistor is arranged outside the forward transmission line and the return transmission line, one end of the fourth resistor is electrically connected to the end the second capacitor not electrically connected to the connector, and the end of the fourth resistor not connected to the second capacitor is electrically connected to the ground of the printed circuit board. In the center-tap termination circuit, the first and second resistors, the first and second capacitors, and the third and fourth resistors are arranged line-symmetrically with respect to the differential signal transmission line, and the forward transmission line and the return transmission line are substantially equidistant from each other.

In a ninth preferred aspect, the connector comprises a component with a jumper function.

In a tenth preferred aspect, the first capacitor has a value of greater than or equal to 1000 pF and less than or equal to 100 $\mu$F.

In an eleventh preferred aspect, a center-tap termination circuit wired is provided on a printed circuit board, the center-tap termination circuit being provided at the end of a differential signal transmission line having a forward transmission line and a return transmission line. The center-tap termination circuit includes a first resistor having a resistance of approximately half the differential impedance of the differential signal transmission line, where the first resistor is arranged outside the forward transmission line and the return transmission line and adjacent to the forward transmission line, and one end of the first resistor is electrically connected to the forward transmission line, and a second resistor having a resistance of approximately half the differential impedance of the differential signal transmission line, where the second resistor is arranged outside the forward transmission line and the return transmission line and adjacent to the return transmission line, and one end of the second resistor is electrically connected to the return transmission line. The center-tap termination circuit also includes a connector electrically connected to the other end of the first resistor and to the other end of the second resistor, where the connector intersects the forward transmission line and the return transmission line in three-dimensional space, and a first capacitor arranged outside the forward transmission line and the return transmission line, where one end of the first capacitor is electrically connected to the connector. Moreover, the center-tap termination circuit includes a third resistor arranged outside the forward transmission line and the return transmission line, where one end of the third resistor is electrically connected to the end of the first capacitor not connected to the connector, the end of the third resistor not connected to the first capacitor is electrically connected to a ground of the printed circuit board, and the third resistor has a resistance derived by subtracting half the value of the first or second resistor from the common mode impedance of the differential signal transmission line. In the center-tap termination circuit, the forward transmission line and the return transmission line are substantially equidistant from each other.

In a twelfth preferred aspect, a printed circuit board is provided, where the printed circuit board includes a transmitting driver integrated circuit (IC), a receiver IC, a differential signal transmission line for transmitting and receiving a signal between the transmitting driver IC and the receiver IC, where the differential signal transmission line consists of a forward transmission line and a return transmission line, the forward transmission line and the return transmission line being substantially equidistant from each other, and a center-tap termination circuit provided at the end of the differential signal transmission line. The center-tap termination circuit includes a first resistor having a resistance of approximately half the differential impedance of the differential signal transmission line, where the first resistor is arranged outside the forward transmission line and the return transmission line and adjacent to the forward transmission line, and one end of the first resistor is electrically connected to the forward transmission line, and a second resistor having a resistance of approximately half the differential impedance of the differential signal transmission line, where the second resistor is arranged outside the forward transmission line and the return transmission line and adjacent to the return transmission line, and one end of the second resistor is electrically connected to the return transmission line. The center-tap termination circuit also includes a connector electrically connected to the other end of the first resistor and to the other end of the second resistor, where the connector intersects the forward transmission line and the return transmission line in three-dimensional space, and a first capacitor arranged outside the forward transmission line and the return transmission line, where one end of the first capacitor is electrically connected to the connector, and the other end of the first capacitor is connected to a ground of the printed circuit board.

Further objects, features, and advantages of the present invention will become apparent from the following description of the preferred embodiments with reference to the attached drawings.

DESCRIPTION OF THE PREFERRED EMBODIMENTS

Embodiments of the present invention will be described with reference to the drawings.

First Embodiment

Figure 1A:
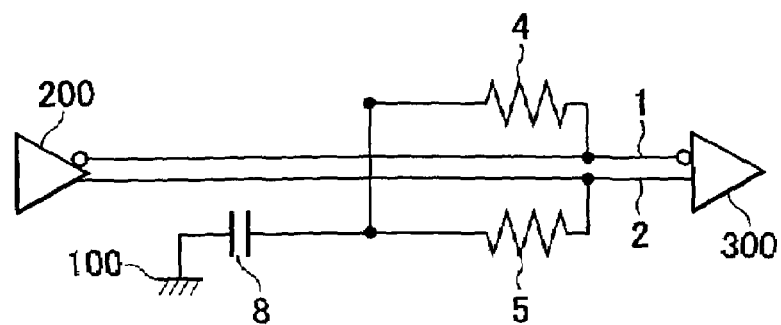
FIG. 1A is a circuit diagram showing a center-tap termination circuit, according to a first embodiment of the present invention, in an LVDS transmission model.
Figure 1B:
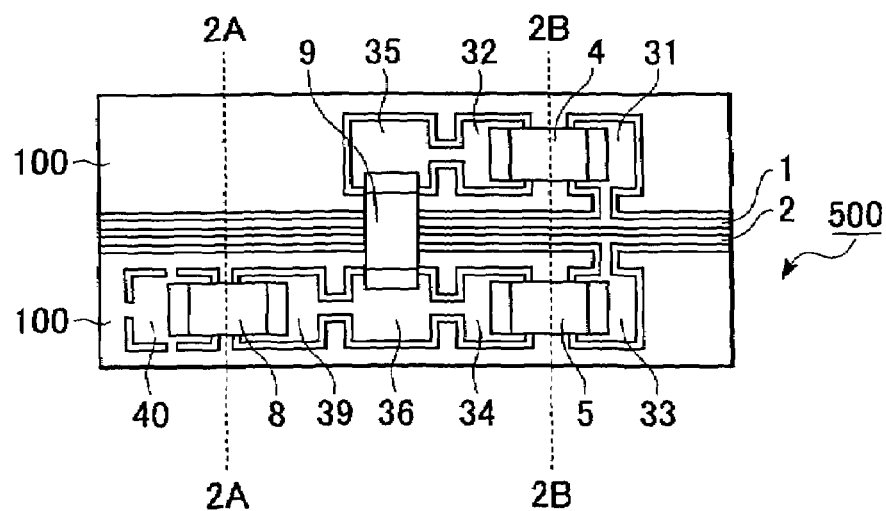
FIG. 1B is a plan view of a printed circuit board having the center-tap termination circuit.

FIGS. 1A and 1B illustrate a center-tap termination circuit, according to a first embodiment of the present invention, in a differential signal transmission line. In the first embodiment, the differential signal transmission line preferably has a differential impedance of 100 Ω.

Figure 10A:
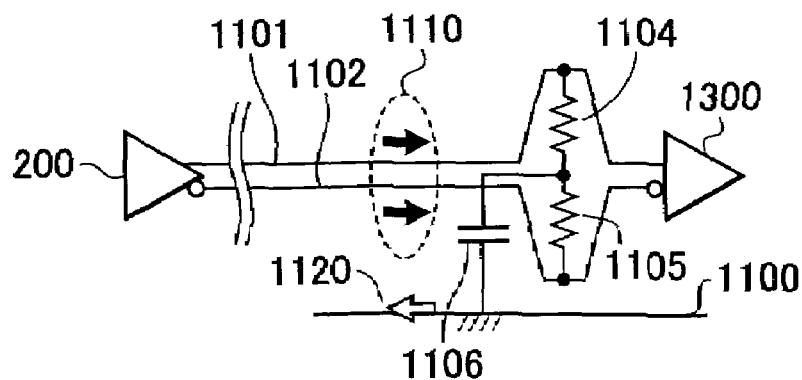
FIG. 10A is a circuit diagram showing a center-tap termination circuit in an LVDS transmission model according to the related art.
Figure 10B:
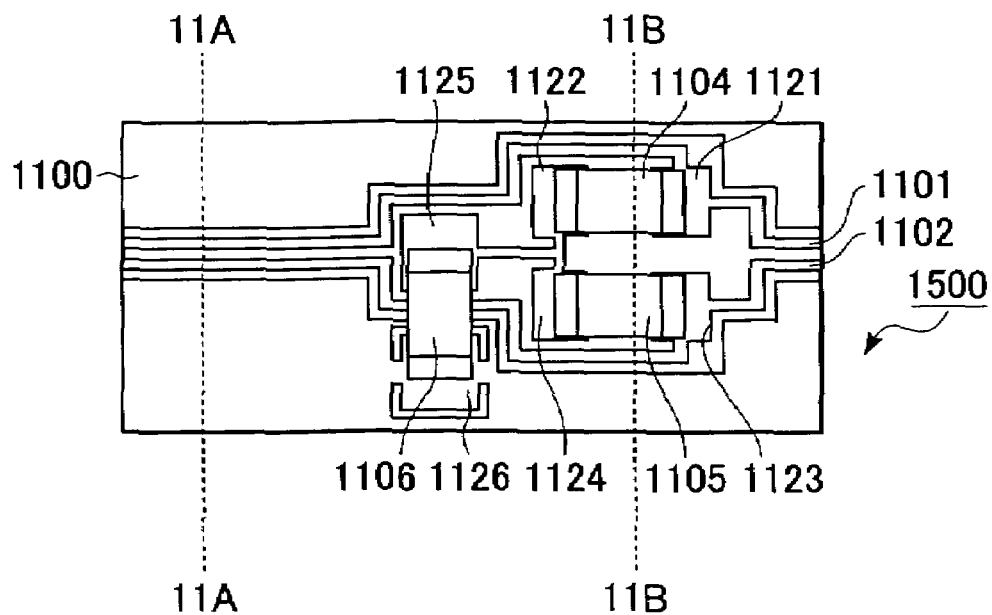
FIG. 10B is a plan view of a printed circuit board having the center-tap termination circuit.
Figure 11A:
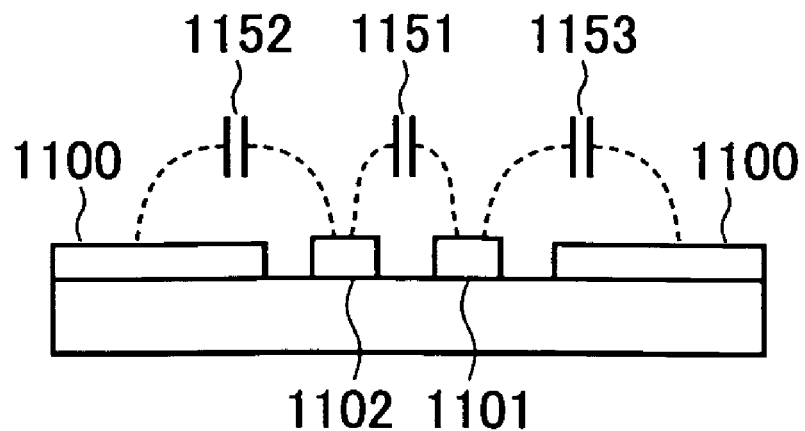
FIG. 11A is a sectional view taken along line 11A—11A of FIG. 9B.
Figure 11B:
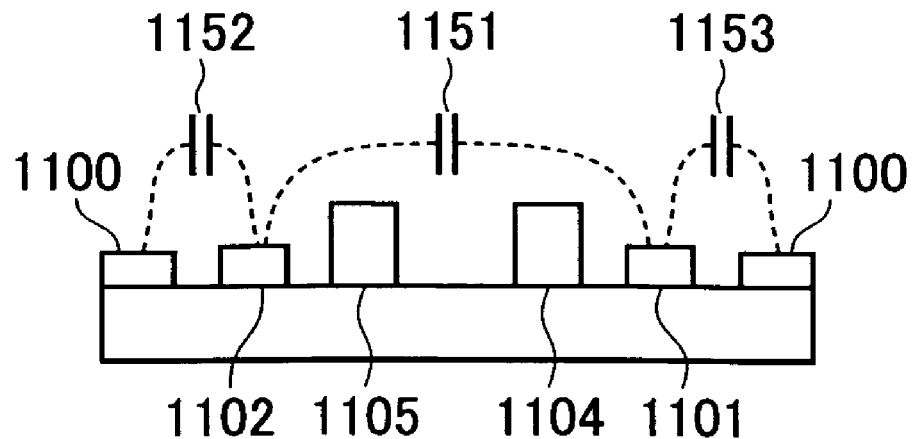
FIG. 11B is a sectional view taken along line 11B—11B of FIG. 9B.
Figure 12:
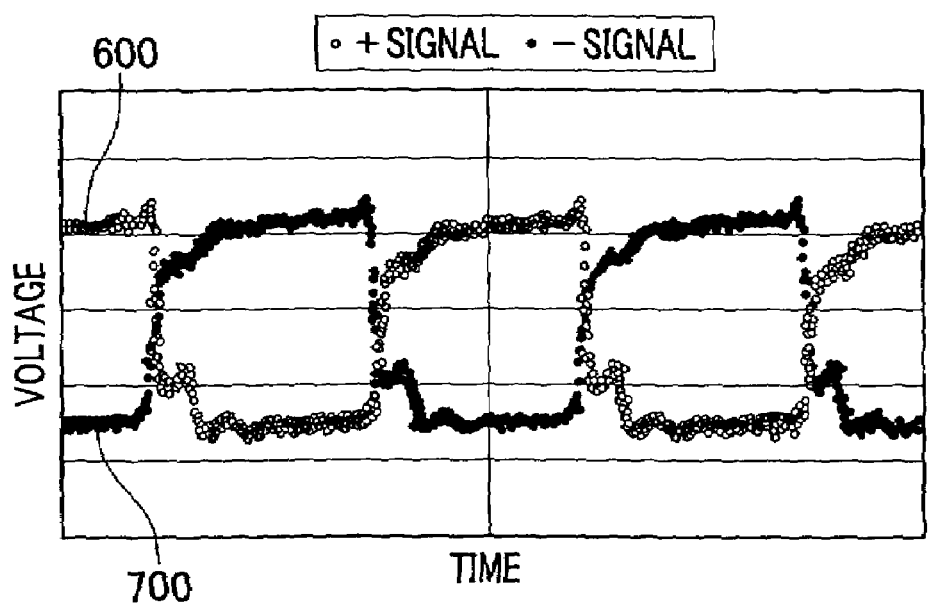
FIG. 12 is a graph showing differential signal waveforms according to the related art.

FIG. 1A is a circuit diagram showing a center-tap termination circuit in an LVDS transmission model. The circuit diagram shown in FIG. 1A is schematically the same as that shown in FIG. 10A, but the physical layout of components thereof is significantly different.

FIGS. 1A and 1B depict a ground (GND) 100; a transmitting driver IC 200; a receiver IC 300; a forward transmission line 1; and a return transmission line 2. The forward transmission line 1 and the return transmission line 2 connect the transmitting driver IC 200 with the receiver IC 300. The forward transmission line 1 and the return transmission line 2 have the same electrical characteristics and constitute a differential signal transmission line for transmitting a low-voltage differential signal from the transmitting driver IC 200 to the receiver IC 300. In the vicinity of the input port of the return transmission line 2, one end of a resistor 4 is connected to the forward transmission line 1, and one end of a resistor 5 is connected to the return transmission line 2. The other ends of the resistors 4 and 5 are electrically connected with each other by wiring them so as to intersect the forward transmission line 1 and the return transmission line 2 in three-dimensional space. In other words, the resistors 4 and 5 are serially connected between the forward transmission line 1 and the return transmission line 2. A connector that interconnects the forward transmission line 1 and the return transmission line 2 is implemented using a component with a jumper function. A connector that interconnects the resistors 4 and 5 is connected to the GND 100 via a capacitor 8. Since the differential impedance of the differential signal transmission line is preferably 100 Ω, the resistors 4 and 5 each preferably have a resistance of 50 Ω to terminate differential mode current components.

Preferably, the capacitor 8 has a capacitance greater than or equal to 1000 pF and less than or equal to 100 μF. Characteristics of common mode noise current flowing through the differential signal transmission line are influenced by the terminating impedance characteristics viewed from the ground. The capacitance 1000 pF has an impedance of 1 to 6 Ω in the noise emission control frequency band of 30 MHz to 1000 MHz. Since a termination resistor containing two parallel-connected 50-ohm resistors has an impedance of 25 Ω, the terminating impedance viewed from the ground is 25 Ω+(1 Ω to 6 Ω), or 26 to 31 Ω. This is a very small value compared with the open state (∞ Ω) in which no capacitor is connected, and, as such, noise emissions are sufficiently reduced.

When the capacitor has a capacitance of 100 pF, the impedance in the above frequency band is approximately 3 to 50 Ω. Depending on the frequency, the maximum terminating impedance is approximately 75 Ω. This is a relatively large value, and hence noise emissions are not sufficiently reduced. When the capacitor has a capacitance of 0.01 μF, the impedance at 30 MHz to 1 GHz is 0.2 to 6 Ω. The terminating impedance viewed from the ground is 25.2 Ω to 31 Ω. Since this value is almost the same as that in the case of 1000 pF, suppression of noise emissions is equivalent to the case of 1000 pF.

When the capacitor has a large capacitance of 100 μF or greater, the size of the capacitor is increased, and the series parasitic inductance is increased. As a result, the impedance at 30 MHz to 1 GHz is increased. Therefore, preferably the capacitor has a capacitance of 100 μF or less.

FIG. 1B is a plan view of a printed circuit board having the center-tap termination circuit shown in FIG. 1A. In FIG. 1B, components corresponding to those in FIG. 1A are given the same reference numerals. FIG. 1B depicts a printed circuit board 500. The forward transmission line 1 and the return transmission line 2 are made from a copper foil pattern. The width of the forward transmission line 1 and the return transmission line 2 is 0.125 mm, and the distance between the forward transmission line 1 and the return transmission line 2 is also 0.125 mm. The resistors 4 and 5 have the same resistance and are chip resistors. The capacitor 8 has a capacitance of 1000 pF and is a chip capacitor. A jumper 9 is a chip jumper. The forward transmission line 1 and the return transmission line 2 extend to the left of FIG. 1B and are connected to the transmitting driver IC (not shown). Similarly, the forward transmission line 1 and the return transmission line 2 extend to the right of FIG. 1B and are connected to the receiver IC (not shown). The GND 100 is made with a pattern outside the forward transmission line 1 and the return transmission line 2.

A first terminal of the resistor 4 is mounted on a land 31. Since the land 31 is provided outside the forward transmission line 1 so as to be electrically connected to the forward transmission line 1, the resistor 4 is electrically connected to the forward transmission line 1. A first terminal of the resistor 5 is mounted on a land 33. Since the land 33 is provided outside the return transmission line 2 so as to be electrically connected to the return transmission line 2, the resistor 5 is electrically connected to the return transmission line 2. A second terminal of the resistor 4 is mounted on a land 32. A second terminal of the resistor 5 is mounted on a land 34. The lands 32 and 34 are provided outside the forward transmission line 1 and the return transmission line 2. The land 32 is electrically connected to a land 35, and the land 34 is electrically connected to a land 36. On the lands 35 and 36, the jumper 9 is mounted, passing over both the forward transmission line 1 and the return transmission line 2. The lands 35 and 36 correspond to the central potential of the differential signal transmission line, and are electrically connected with each other, in conjunction with the forward transmission line 1 and the return transmission line 2, by the wiring of the 50-ohm resistors 4 and 5. A first terminal of the capacitor 8 is mounted on a land 39. A second terminal of the capacitor 8 is mounted on a land 40 that is electrically connected to the GND 100. In the first embodiment, the capacitor 8 is provided outside the return transmission line 2, however, the arrangement of the return transmission line 2 is not limited to this arrangement in the first embodiment. Alternatively, for example, the capacitor 8 and lands 39 and 40 may be provided outside the forward transmission line 1 and the land 39 electrically connected with the land 35.

The center-tap termination circuit of the first embodiment includes the resistors 4 and 5, the capacitor 8, and the jumper 9, which are mounted on the forward transmission line 1 and the return transmission line 2. Since all of the resistors 4 and 5, the capacitor 8, and the jumper 9 are disposed outside the forward transmission line 1 and the return transmission line 2 in the first embodiment, the distance between the forward transmission line 1 and the return transmission line 2 is maintained at a substantially constant 0.125 mm, even in the region of the center-tap termination circuit.

Figure 2A:
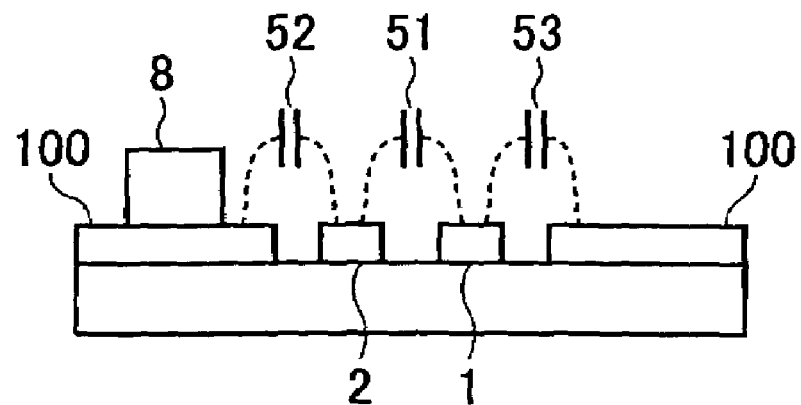
FIG. 2A is a sectional view taken along line 2A—2A of FIG. 1B.
Figure 2B:
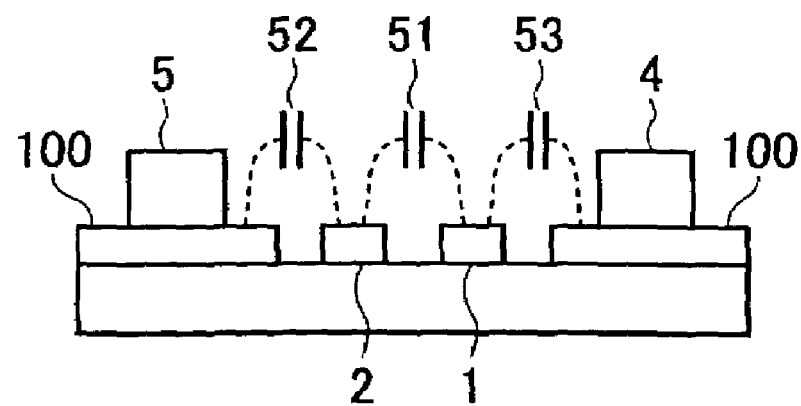
FIG. 2B is a sectional view taken along line 2B—2B of FIG. 1B.

FIG. 2A is a sectional view taken along line 2A—2A of FIG. 1B, and FIG. 2B is a sectional view taken along line 2B—2B of FIG. 1B. As is clear by comparing FIG. 2A with FIG. 2B, the distance between the forward transmission line 1 and the return transmission line 2, the distance between the forward transmission line 1 and the GND 100, and the distance between the return transmission line 2 and the GND 100 are substantially equal.

The sectional shapes shown in FIGS. 2A and 2B are substantially the same. More specifically, reference numeral 51 denotes the capacitive coupling between the forward transmission line 1 and the return transmission line 2, reference numeral 53 denotes the capacitive coupling between the forward transmission line 1 and the GND 100, and reference numeral 52 denotes the capacitive coupling between the return transmission line 2 and the GND 100 or the capacitor 8. There is almost no difference in the capacitive coupling 51, the capacitive coupling 52, and the capacitive coupling 53 between FIGS. 2A and 2B. This shows that the differential impedance at the position of line 2A—2A of FIG. 1B is the same as that at the position of line 2B—2B of FIG. 1B. Since the distance between the forward transmission line 1 and the return transmission line 2 is constant in the center-tap termination circuit, the differential impedance is constant not only at the positions of line 2A—2A and line 2B—2B, but also at all points within the center-tap termination circuit.

Figure 3:
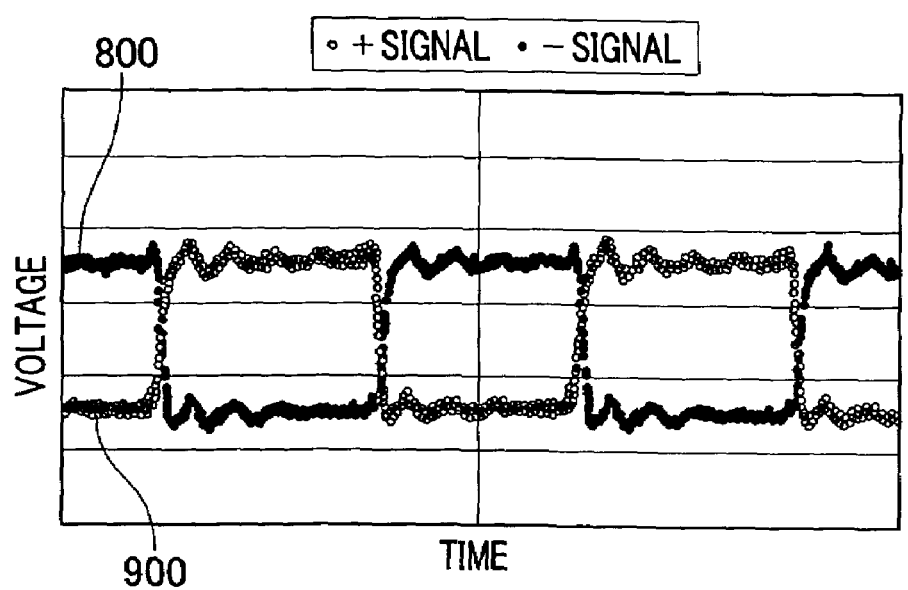
FIG. 3 is a graph showing differential signal waveforms according to the first embodiment.

FIG. 3 is a graph showing the waveforms of differential signals in the above case in which time is shown on the abscissa, and voltage is shown on the ordinate. Referring to FIG. 3, a signal 800 is transmitted through the forward transmission line 1, and a signal 900 is transmitted through the return transmission line 2. As is clear from FIG. 3, the transmission return/transmission forward characteristics of the signals 800 and 900 roughly match each other, and no skew is present. In other words, differential impedance matching is achieved, and high-quality signal waveforms are maintained.

By keeping the distance between the forward transmission line 1 and the return transmission line 2, substantially constant at all points, even within the region of the center-tap termination circuit, the differential impedance becomes constant. Therefore, the differential impedance matching is achieved, and the generation of common mode current components is greatly suppressed. As a result, the generation of noise emissions is greatly suppressed.

Referring to FIG. 1B, the resistors 4 and 5 are ordinarily mounted with a predetermined distance between each other due to the mechanical limitations of a mounting machine. Therefore, the resistors 4 and 5 are mounted with a predetermined distance between each other. The width of each of the forward transmission line 1 and the return transmission line 2 is preferably 0.125 mm, and the distance between the forward transmission line 1 and the return transmission line 2 is preferably 0.125 mm. In the first embodiment, even when the resistor 4 is separated from the resistor 5 by the minimum distance, the forward transmission line 1 and the return transmission line 2 can be disposed between the resistors 4 and 5.

With the arrangement described herein, there is typically no dead space between the resistors 4 and 5, and wiring of the forward and return transmission lines outside the resistors 4 and 5 is removed. As a result, the width of the center-tap termination circuit in the direction of the differential signal transmission line is adjusted to the minimum mountable width of the chip resistors 4 and 5. The area in which the center-tap termination circuit is mounted is reduced, the density of the printed circuit board is increased, and the size of an electronic apparatus is reduced. It is particularly beneficial for a circuit having many parallel pairs of differential signal lines, as in bus wiring, to reduce the width of the wiring area. Thus, reduction in the width of the center-tap termination circuit in the direction of the differential signal transmission line has significant advantages.

Second Embodiment

Figure 4A:
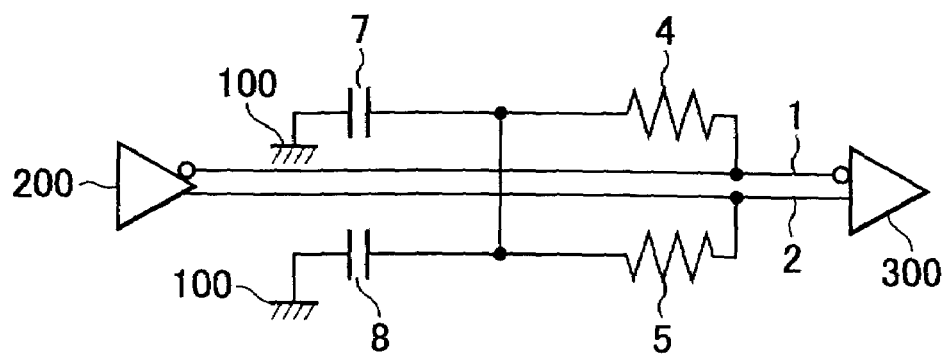
FIG. 4A is a circuit diagram showing a center-tap termination circuit, according to a second embodiment of the present invention, in an LVDS transmission model.
Figure 4B:
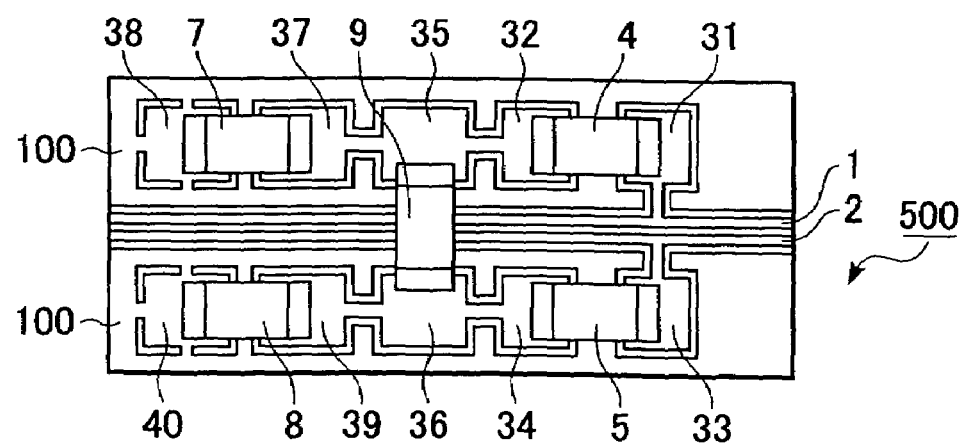
FIG. 4B is a plan view of a printed circuit board having the center-tap termination circuit.

FIGS. 4A and 4B illustrate a center-tap termination circuit, according to a second embodiment of the present invention, in a differential signal transmission line. In the second embodiment, the differential signal transmission line preferably has a differential impedance of 100 Ω.

FIG. 4A is a circuit diagram showing a center-tap termination circuit in an LVDS transmission model. FIG. 4B is a plan view of a printed circuit board having the center-tap termination circuit shown in FIG. 4A. In FIGS. 4A and 4B, components corresponding to those in FIGS. 1A and 1B are given the same reference numerals, and descriptions of the common components are omitted.

The center-tap termination circuit shown in FIG. 4A is the same circuit as that shown in FIG. 1A with an additional capacitor 7. Referring to FIG. 4B, a first terminal of the capacitor 7 is mounted on a land 37 that is electrically connected to the land 35. A second terminal of the capacitor 7 is mounted on a land 38 that is electrically connected to the GND 100. In other words, the capacitors 7 and 8 are provided outside both the forward transmission line 1 and the return transmission line 2.

According to the second embodiment, the left and right sides of the forward transmission line 1 and the return transmission line 2 are physically symmetrical. Compared with the first embodiment, the differential impedance of the differential signal transmission line becomes more stable. As a result, the differential impedance matching is achieved, the quality of transmitted differential signals is further improved, and the generation of common mode current components is further suppressed. Therefore, the generation of noise emissions is greatly suppressed.

Third Embodiment

Figure 5A:
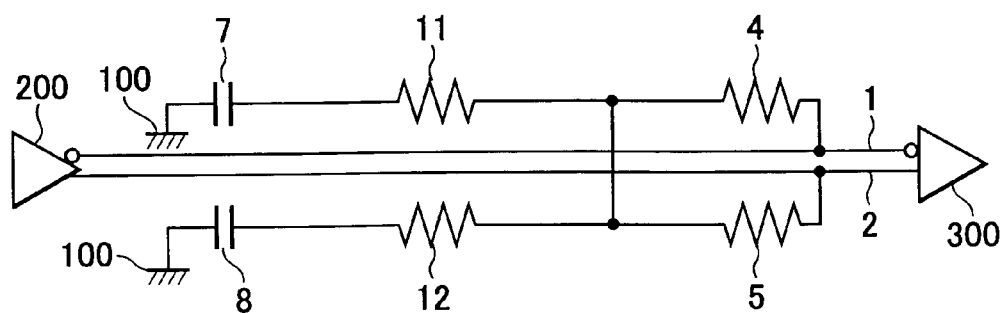
FIG. 5A is a circuit diagram showing a center-tap termination circuit, according to a third embodiment of the present invention, in an LVDS transmission model.
Figure 5B:
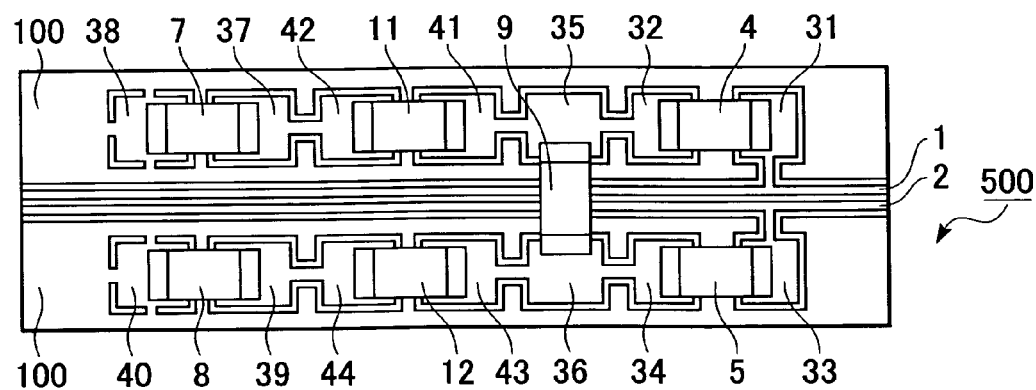
FIG. 5B is a plan view of a printed circuit board having the center-tap termination circuit.

FIGS. 5A and 5B illustrate a center-tap termination circuit, according to a third embodiment of the present invention, in a differential signal transmission line. In the third embodiment, the differential signal transmission line preferably has a differential impedance of 100 Ω.

FIG. 5A is a circuit diagram showing a center-tap termination circuit in an LVDS transmission model. FIG. 5B is a plan view of a printed circuit board having the center-tap termination circuit shown in FIG. 5A. In FIGS. 5A and 5B, components corresponding to those in FIGS. 4A and 4B are given the same reference numerals, and descriptions of the common components are omitted.

The center-tap termination circuit shown in FIG. 5A is the same circuit as that shown in FIG. 1A with additional resistors 11 and 12 disposed between the capacitors 7 and 8 and the jumper 9. The resistors 11 and 12 are serially connected to the capacitors 7 and 8, respectively. Referring to FIG. 5B, a first terminal of the resistor 11 is mounted on a land 41 that is electrically connected to the land 35, and a second terminal of the capacitor 11 is mounted on a land 42 that is electrically connected to the land 37. A first terminal of the resistor 12 is mounted on a land 43 that is electrically connected to the land 36, and a second terminal of the resistor 12 is mounted on a land 44 that is electrically connected to the land 39.

Resistances of the resistors 11 and 12 are selected so that the resistance of resistive components at the termination with respect to common mode current components ((resistance of the resistor 11/2+resistance of the resistor 4/2) or (resistance of the resistor 12/2+ resistance of the resistor 5/2)) matches the common mode impedance of the differential signal transmission line. Since the resistance of each of the resistors 4 and 5 is 50 Ω and the common mode impedance is approximately 60 Ω, the resistance of each of the resistors 11 and 12 is set to 70 Ω. The capacitance of each of the capacitors 7 and 8 is set to 1000 pF, which is the same as in the second embodiment.

In the third embodiment, the components are mounted in the following order starting from the GND 100: the capacitor 7 and the resistor 11, and the capacitor 8 and the resistor 12. However, the order is not limited to this order, and the components may be arranged in a different order, such as the following: the resistor 11 and the capacitor 7, and the resistor 12 and the capacitor 8.

Figure 6A:
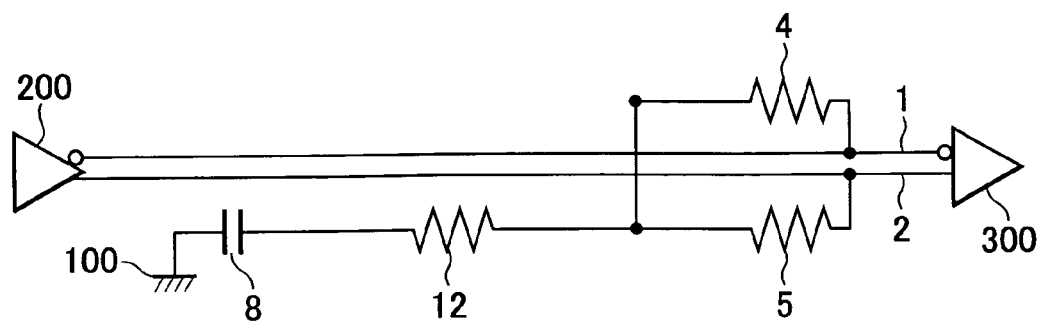
FIG. 6A is a circuit diagram showing a center-tap termination circuit, according to a modification of the third embodiment of the present invention, in an LVDS transmission model.
Figure 6B:
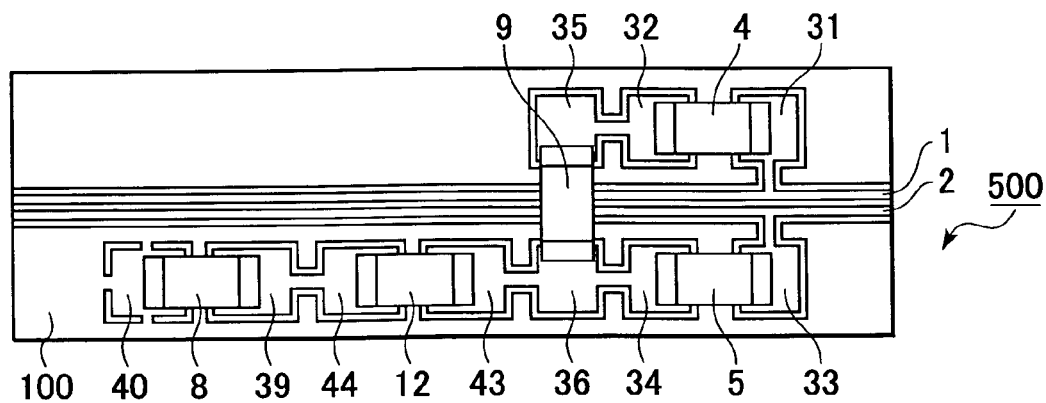
FIG. 6B is a plan view of a printed circuit board having the center-tap termination circuit.

Although the capacitors 7 and 8 and the resistors 11 and 12 are disposed on both sides of the differential signal transmission line, they can be disposed on only one side, as shown in FIGS. 6A and 6B. In the latter case, the capacitance of the capacitor 8 is set to 1000 pF, and the value of the resistor 12 is set to 35 Ω.

When the center-tap termination circuit of the third embodiment is arranged as described above, in addition to the advantages achieved in the first and second embodiment, because of advantages achieved by the resistors 11 and 12, common mode current components are further suppressed, thereby suppressing noise emissions.

Fourth Embodiment

Figure 7A:
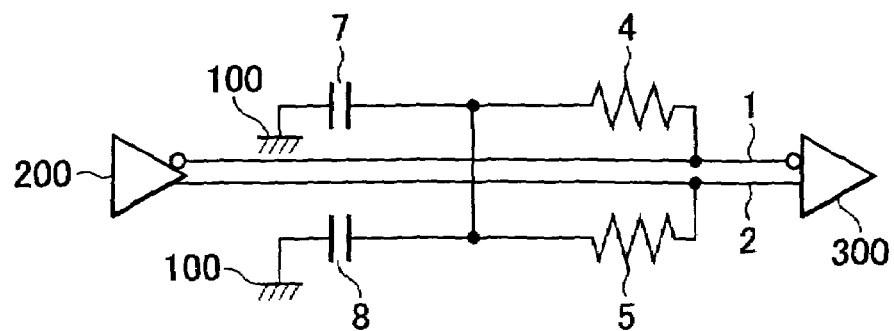
FIG. 7A is a circuit diagram showing a center-tap termination circuit, according to a fourth embodiment of the present invention, in an LVDS transmission model.
Figure 7B:
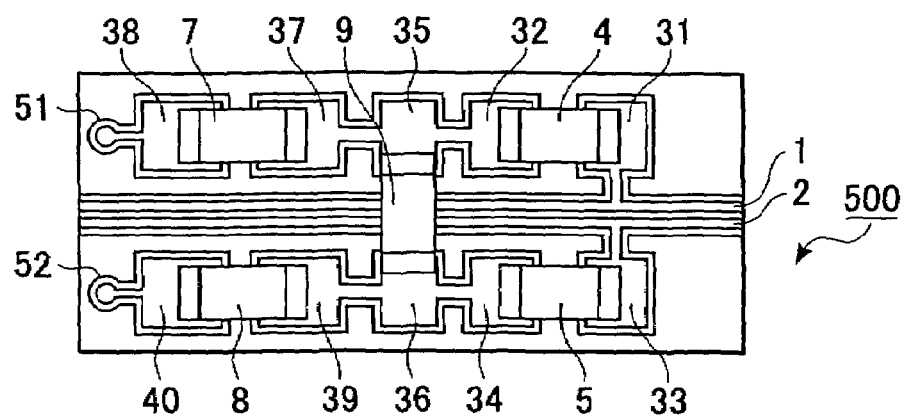
FIG. 7B is a plan view of a printed circuit board having the center-tap termination circuit.

FIGS. 7A and 7B illustrate a center-tap termination circuit, according to a fourth embodiment of the present invention, in a differential signal transmission line. In the fourth embodiment, the center-tap termination circuit disposed in the differential signal transmission line is provided on a multilayer printed circuit board. In the fourth embodiment, the differential signal transmission line preferably has a differential impedance of 100 Ω.

FIG. 7A is a circuit diagram showing a center-tap termination circuit in an LVDS transmission model. FIG. 7B is a plan view of a printed circuit board having the center-tap termination circuit shown in FIG. 7A. In FIGS. 7A and 7B, components corresponding to those in FIGS. 4A and 4B are given the same reference numerals, and descriptions of the common components are omitted.

The center-tap termination circuit shown in FIG. 7A is similar to that shown in FIG. 4A. Referring to FIG. 7B, instead of the GND 100 shown in FIG. 4B, a solid pattern serving as the GND (not shown) is provided on the back side of the printed circuit board or on another wiring layer. The land 38 to which the capacitor 7 is connected is connected through a through hole 51 to the solid pattern serving as the GND provided on the back side of the printed circuit board or on the other wiring layer. Similarly, the land 40 to which the capacitor 8 is connected is connected through a through hole 52 to the solid pattern serving as the GND provided on the back side of the printed circuit board or on the other wiring layer.

When the center-tap termination circuit of the fourth embodiment is arranged as described above, the same advantages as those achieved in the first and second embodiments can be achieved even on the multilayer printed circuit board.

Figure 8:
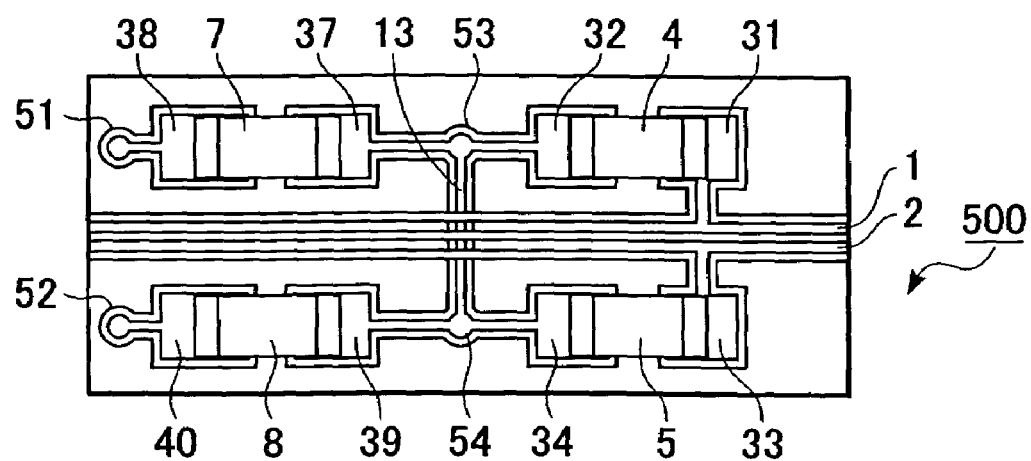
FIG. 8 is a plan view of a multilayer printed circuit board having the center-tap termination circuit shown in FIG. 4A.
Figure 9:
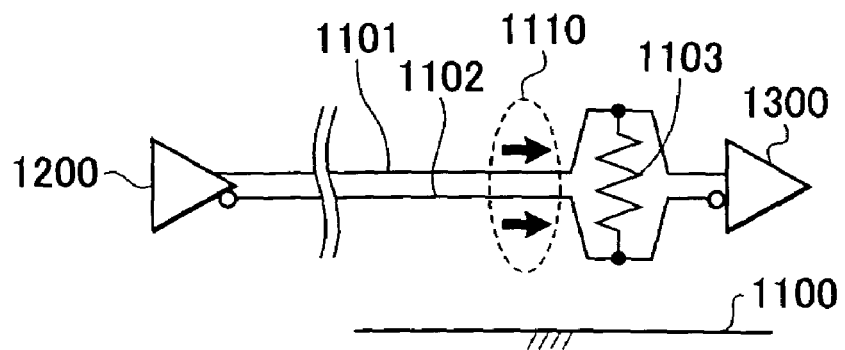
FIG. 9 is a circuit diagram showing a known termination circuit in an LVDS transmission model.

Referring to FIG. 8, through holes 53 and 54 are provided at the positions of the lands 35 and 36 shown in FIG. 7B. Accordingly, instead of using the jumper 9, wiring 13 on the back side of the printed circuit board or on the other wiring layer can be used. Since this wiring can be used, the jumper 9 becomes unnecessary, resulting in lower component costs and manufacturing costs.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A center-tap termination circuit wired on a printed circuit board, the center-tap termination circuit being provided at the end of a differential signal transmission line having a forward transmission line and a return transmission line, comprising:

a first resistor having a resistance of approximately half the differential impedance of the differential signal transmission line, wherein the first resistor is arranged outside the forward transmission line and the return transmission line and adjacent to the forward transmission line, and one end of the first resistor is electrically connected to the forward transmission line;

a second resistor having a resistance of approximately half the differential impedance of the differential signal transmission line, wherein the second resistor is arranged outside the forward transmission line and the return transmission line and adjacent to the return transmission line, and one end of the second resistor is electrically connected to the return transmission line;

a connector electrically connected to the end of the first resistor not connected to the forward transmission line and to the end of the second resistor not connected to the return transmission line, wherein the connector intersects the forward transmission line and the return transmission line in three-dimensional space; and a first capacitor arranged outside the forward transmission line and the return transmission line, wherein one end of the first capacitor is electrically connected to the connector, and the end of the first capacitor not connected to the connector is connected to a ground of the printed circuit board, wherein the forward transmission line and the return transmission line are substantially equidistant from each other.

2. A center-tap termination circuit according to claim 1, wherein the connector comprises a component with a jumper function.

3. A center-tap termination circuit according to claim 1, wherein the first capacitor has a value of greater than or equal to 1000 pF and less than or equal to 100 µF.

4. A center-tap termination circuit wired on a printed circuit board, the center-tap termination circuit being provided at the end of a differential signal transmission line having a forward transmission line and a return transmission line, comprising:

a first resistor having a resistance of approximately half the differential impedance of the differential signal transmission line, wherein the first resistor is arranged outside the forward transmission line and the return transmission line and adjacent to the forward transmission line, and one end of the first resistor is electrically connected to the forward transmission line;

a second resistor having a resistance of approximately half the differential impedance of the differential signal transmission line, wherein the second resistor is arranged outside the forward transmission line and the return transmission line and adjacent to the return transmission line, and one end of the second resistor is electrically connected to the return transmission line;

a connector electrically connected to the end of the first resistor not connected to the forward transmission line and to the other end of the second resistor not connected to the return transmission line, wherein the connector intersects the forward transmission line and the return transmission line in three-dimensional space;

a first capacitor arranged outside the forward transmission line and the return transmission line, wherein one end of the first capacitor is electrically connected to the connector, and the end of the first capacitor not connected to the connector is connected to a ground of the printed circuit board; and a second capacitor having the same capacitance as that of the first capacitor, wherein the second capacitor is arranged outside the forward transmission line and the return transmission line, one end of the second capacitor is electrically connected to the connector, and the end of the second capacitor not connected to the connector is connected to the ground of the printed circuit board, wherein the first and second resistors and the first and second capacitors are arranged line-symmetrically with respect to the differential signal transmission line, and wherein the forward transmission line and the return transmission line are substantially equidistant from each other.

5. A center-tap termination circuit according to claim 4, wherein the connector comprises a component with a jumper function.

6. A center-tap termination circuit according to claim 4, wherein the first and second capacitors each have a value of greater than or equal to 1000 pF and less than or equal to 100 $\mu$F.

7. A center-tap termination circuit according to claim 4, wherein the printed circuit board comprises a multilayer printed circuit board having a plurality of layers;

wherein the differential signal transmission line is provided on a surface layer of the printed circuit board; and wherein the first capacitor is connected through a first through hole to a ground provided on a wiring layer differing from the surface layer of the printed circuit board; and wherein the second capacitor is connected through a second through hole to the ground provided on the wiring layer differing from the surface layer of the printed circuit board.

8. A center-tap termination circuit according to claim 4, wherein the printed circuit board comprises a multilayer printed circuit board having a plurality of layers;

wherein the differential signal transmission line is provided on a surface layer of the printed circuit board; and wherein the connector comprises a wire led through third and fourth through holes to a wiring layer differing from the surface layer of the printed circuit board.

9. A center-tap termination circuit wired on a printed circuit board, the center-tap termination circuit being provided at the end of a differential signal transmission line having a forward transmission line and a return transmission line, comprising:

a first resistor having a resistance of approximately half the differential impedance of the differential signal transmission line, wherein the first resistor is arranged outside the forward transmission line and the return transmission line and adjacent to the forward transmission line, and one end of the first resistor is electrically connected to the forward transmission line;

a second resistor having a resistance of approximately half the differential impedance of the differential signal transmission line, wherein the second resistor is arranged outside the forward transmission line and the return transmission line and adjacent to the return transmission line, and one end of the second resistor is electrically connected to the return transmission line;

a connector electrically connected to the end of the first resistor not connected to the forward transmission line and to the end of the second resistor not connected to the return transmission line, wherein the connector intersects the forward transmission line and the return transmission line in three-dimensional space;

a first capacitor arranged outside the forward transmission line and the return transmission line, wherein one end of the first capacitor is electrically connected to the connector;

a second capacitor having the same capacitance as that of the first capacitor, wherein the second capacitor is arranged outside the forward transmission line and the return transmission line, and one end of the second capacitor is electrically connected to the connector;

a third resistor arranged outside the forward transmission line and the return transmission line, wherein one end of the third resistor is electrically connected to the other end of the first capacitor, the end of the third resistor not connected to the first capacitor is electrically connected to a ground of the printed circuit board, and the third resistor has a resistance that is twice the value derived by subtracting half the value of the first or second resistor from the common mode impedance of the differential signal transmission line; and a fourth resistor having the same resistance as that of the third resistor, wherein the fourth resistor is arranged outside the forward transmission line and the return transmission line, one end of the fourth resistor is electrically connected to the end the second capacitor not electrically connected to the connector, and the end of the fourth resistor not connected to the second capacitor is electrically connected to the ground of the printed circuit board, wherein the first and second resistors, the first and second capacitors, and the third and fourth resistors are arranged line-symmetrically with respect to the differential signal transmission line, and wherein the forward transmission line and the return transmission line are substantially equidistant from each other.

10. A center-tap termination circuit according to claim 9, wherein the connector comprises a component with a jumper function.

11. A center-tap termination circuit according to claim 9, wherein the first capacitor has a value of greater than or equal to 1000 pF and less than or equal to 100 $\mu$F.

12. A center-tap termination circuit wired on a printed circuit board, the center-tap termination circuit being provided at the end of a differential signal transmission line having a forward transmission line and a return transmission line, comprising:

a first resistor having a resistance of approximately half the differential impedance of the differential signal transmission line, wherein the first resistor is arranged outside the forward transmission line and the return transmission line and adjacent to the forward transmission line, and one end of the first resistor is electrically connected to the forward transmission line;

a second resistor having a resistance of approximately half the differential impedance of the differential signal transmission line, wherein the second resistor is arranged outside the forward transmission line and the return transmission line and adjacent to the return transmission line, and one end of the second resistor is electrically connected to the return transmission line;

a connector electrically connected to the other end of the first resistor and to the other end of the second resistor, wherein the connector intersects the forward transmis sion line and the return transmission line in three-dimensional space;

a first capacitor arranged outside the forward transmission line and the return transmission line, wherein one end of the first capacitor is electrically connected to the connector; and a third resistor arranged outside the forward transmission line and the return transmission line, wherein one end of the third resistor is electrically connected to the end of the first capacitor not connected to the connector, the end of the third resistor not connected to the first capacitor is electrically connected to a ground of the printed circuit board, and the third resistor has a resistance derived by subtracting half the value of the first or second resistor from the common mode impedance of the differential signal transmission line, wherein the forward transmission line and the return transmission line are substantially equidistant from each other.

13. A printed circuit board comprising:

a transmitting driver integrated circuit (IC);

a receiver IC;

a differential signal transmission line for transmitting and receiving a signal between the transmitting driver IC and the receiver IC, wherein the differential signal transmission line consists of a forward transmission line and a return transmission line, the forward transmission line and the return transmission line being substantially equidistant from each other; and a center-tap termination circuit provided at the end of the differential signal transmission line, the center-tap termination circuit comprising:

a first resistor having a resistance of approximately half the differential impedance of the differential signal transmission line, wherein the first resistor is arranged outside the forward transmission line and the return transmission line and adjacent to the forward transmission line, and one end of the first resistor is electrically connected to the forward transmission line;

a second resistor having a resistance of approximately half the differential impedance of the differential signal transmission line, wherein the second resistor is arranged outside the forward transmission line and the return transmission line and adjacent to the return transmission line, and one end of the second resistor is electrically connected to the return transmission line;

a connector electrically connected to the other end of the first resistor and to the other end of the second resistor, wherein the connector intersects the forward transmission line and the return transmission line in three-dimensional space; and a first capacitor arranged outside the forward transmission line and the return transmission line, wherein one end of the first capacitor is electrically connected to the connector, and the other end of the first capacitor is connected to a ground of the printed circuit board.

* * * * *

UNITED STATES PATENT AND TRADEMARK OFFICE
CERTIFICATE OF CORRECTION

PATENT NO. : 6,995,629 B2 Page 1 of 1
APPLICATION NO. : 10/695732
DATED : February 7, 2006
INVENTOR(S) : Shinichi Nishimura It is certified that error appears in the above-identified patent and that said Letters Patent is hereby corrected as shown below:

<u>ON COVER PAGE AT (57) ABSTRACT</u>

Line 7, "6" should be deleted.

<u>COLUMN 10</u>

Line 28, "2," should read --2;--.

Signed and Sealed this

Twenty-second Day of August, 2006

JON W. DUDAS
*Director of the United States Patent and Trademark Office*